(12) United States Patent
Samber et al.

(10) Patent No.: US 8,251,538 B2
(45) Date of Patent: Aug. 28, 2012

(54) LIGHTING DEVICE

(75) Inventors: Marc Andre Samber, Lommel (BE);
Ralph Hubert Peters, Maastricht (NL);
Joseph Ludovicus Sormani, Knegsel (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 155 days.

(21) Appl. No.: 12/302,607

(22) PCT Filed: Jun. 6, 2007

(86) PCT No.: PCT/IB2007/052132
§ 371 (c)(1),
(2), (4) Date: Nov. 26, 2008

(87) PCT Pub. No.: WO2007/144809
PCT Pub. Date: Dec. 21, 2007

(65) Prior Publication Data
US 2009/0244882 A1    Oct. 1, 2009

(30) Foreign Application Priority Data

Jun. 14, 2006 (EP) .................................. 06115429

(51) Int. Cl.
*F21V 9/16* (2006.01)
(52) U.S. Cl. ...................... 362/231; 362/84; 362/249.02; 313/503
(58) Field of Classification Search ............... 362/231, 362/84, 249.02, 555, 260, 293, 311.02, 800; 257/98; 313/503, 112, 113, 484–487, 512
See application file for complete search history.

(56) References Cited

U.S. PATENT DOCUMENTS

| | | | |
|---|---|---|---|
| 6,274,924 B1 | 8/2001 | Carey et al. | |
| 6,345,903 B1 * | 2/2002 | Koike et al. | 362/241 |
| 6,504,301 B1 * | 1/2003 | Lowery | 313/512 |
| 6,517,213 B1 * | 2/2003 | Fujita et al. | 362/84 |
| 6,547,423 B2 | 4/2003 | Marshall et al. | |
| 7,084,435 B2 * | 8/2006 | Sugimoto et al. | 257/99 |
| 7,180,240 B2 * | 2/2007 | Noguchi et al. | 313/512 |
| 7,514,721 B2 * | 4/2009 | Krames et al. | 257/98 |

(Continued)

FOREIGN PATENT DOCUMENTS

DE        10349038 A1    5/2004

(Continued)

OTHER PUBLICATIONS

Joo Won Kim; "The Effects of Substrates and Deposition Parameters on the Growing and Luminescent Properties of Y3Al5O12:Ce Thin Films" Optical Materials, Elsevier Science Publ. B.B. Amsterdam, NL, vol. 28, No. 6-7, May 2006, pp. 698-702, XP005336880.

(Continued)

*Primary Examiner* — Peggy A. Neils
(74) *Attorney, Agent, or Firm* — John F. Salazar; Mark L. Beloborodov

(57) ABSTRACT

The invention relates to a lighting device (101) comprising a blue light source, e.g. an LED (102), combined with a wavelength converting ceramic (106) and a collimating optical component (110). The ceramic (106) is mechanically carried by the optical component (110), for example by a glue or by insert moulding. Intermediate gaps between the light source (102) and the converter (106) are preferably filled with a material like silicone.

10 Claims, 1 Drawing Sheet

U.S. PATENT DOCUMENTS

| | | | |
|---|---|---|---|
| 7,717,589 B2 * | 5/2010 | Nishioka et al. | 362/293 |
| 7,753,553 B2 * | 7/2010 | Justel et al. | 362/231 |
| 7,799,586 B2 * | 9/2010 | Leung et al. | 438/28 |
| 7,855,395 B2 * | 12/2010 | Lee et al. | 257/99 |
| 8,089,085 B2 * | 1/2012 | Shi | 257/98 |
| 2004/0145308 A1 | 7/2004 | Rossner et al. | |
| 2004/0159900 A1 | 8/2004 | Ouderkirk et al. | |
| 2004/0257797 A1 | 12/2004 | Suchiro et al. | |
| 2005/0006659 A1 * | 1/2005 | Ng et al. | 257/99 |
| 2005/0057144 A1 | 3/2005 | Morita et al. | |
| 2005/0190559 A1 | 9/2005 | Kragl | |
| 2005/0269582 A1 | 12/2005 | Mueller et al. | |
| 2006/0086940 A1 | 4/2006 | Wang et al. | |
| 2008/0186702 A1 * | 8/2008 | Camras et al. | 362/231 |
| 2009/0168395 A1 * | 7/2009 | Mrakovich et al. | 362/84 |

FOREIGN PATENT DOCUMENTS

| | | |
|---|---|---|
| EP | 1418628 A1 | 5/2004 |
| EP | 1443567 A2 | 8/2004 |
| JP | 2000022222 | 1/2000 |
| WO | 2004007241 A2 | 1/2004 |
| WO | 2005053041 A1 | 6/2005 |
| WO | 2005109529 A1 | 11/2005 |
| WO | 2006034703 A1 | 4/2006 |

OTHER PUBLICATIONS

Ken Sakuma et al; "Warm-White Light-Emitting Diode With Yellowish Orange Siaion Ceramic Phosphor", vol. 29, No. 17, Optics Letters, Optical Soc. of America, Washington, DC, US, Sep. 1, 2004, XP002368762.

* cited by examiner

LIGHTING DEVICE

This application is a national stage application under 35 U.S.C. §371 of International Application No. PCT/IB2007/052132 filed on Jun. 6, 2007, and published in the English language on Dec. 21, 2007 as International Publication No. WO/2007/144809, which claims priority to European Application No. 06115429.0, filed on Jun. 14, 2006, incorporated herein by reference.

The invention relates to a lighting device comprising a light emitting diode (LED) and to a method for the production of such a lighting device.

Lighting devices comprising LEDs are rapidly gaining importance for many applications, and a large variety of designs has been proposed for them. The WO 2005/109529 A1, which is incorporated into the present application by reference, describes for example a design in which the LED is embedded in a transparent material and placed in the focus of a reflective collimator. The production of such a device and of similar designs is however rather difficult if tolerances shall be kept small. Moreover, there is a need for lighting devices that allow to generate white emissions.

Based on this background it was an object of the present invention to provide a lighting device that is comparatively easy to produce, robust and capable to generate a broad, particularly white emission spectrum.

This objective is achieved by a lighting device according to claim 1 and a method according to claim 10. Preferred embodiments are disclosed in the dependent claims.

The lighting device according to the present invention comprises the following components:

A light source, particularly a blue light source or an UV light source.

A solid wavelength converter for converting light emitted by the light source into a different wavelength. The wavelength converter may particularly comprise a luminescent material that is excited by light coming from the light source and that re-emits the absorbed energy as light of a different wavelength. In case not all light coming from the light source is captured and converted by the converter, the spectrum of the overall emission of the lighting device will then comprise original light of the light source, which broadens the spectrum. In case of an UV emitting light source, all the radiation should be absorbed.

An optical component for redirecting light emitted by the light source and/or by the converter into a desired direction, for example by reflection or refraction, wherein the converter is mechanically carried by said optical component.

In the described lighting device, the converter and the optical component are combined into one mechanically linked, stable structure. The relative positioning of these two components is therefore achieved with little tolerances, which facilitates the further assemblage and yields products of higher accuracy. Also this structure can be fabricated separately from the total lighting device, allowing an optimal supply chain and a means to optimize fabrication yield by pre-testing this part.

The lighting device is preferably capable to emit white light, particularly with a correlated color temperature (CCT) in the range of 2000 to 6000 K. The emission of a white spectrum is achieved by a proper choice of light source and converter, for example by the combination of a blue light source with a Lumiramic converter (a Lumiramic converter is described in US2005/0269582 A1, which is incorporated into the present application by reference).

The converter may preferably be a ceramic material, e.g. the aforementioned Lumiramic material.

There are different ways to couple the converter mechanically to the optical component. In one preferred variant, this is achieved via an intermediate material, for example a (transparent) glue like epoxy resin. The optical component and the converter will in this case typically be separate prefabricated structures, which are then linked by an initially liquid intermediate material that solidifies or cures after its application.

In another variant, the converter is mechanically coupled to the optical component by molecular adhesion. This can particularly be achieved by moulding the plastic material of the optical component around the prefabricated, solid converter.

In a further development of the invention, a transparent filling material like silicone fills gaps between the light source and the converter. Thus a good optical coupling can be achieved and remaining tolerances in the positioning of components can be compensated for.

While the main function of the optical component is to redirect light that leaves the converter into a preferred direction, it may additionally comprise reflective surfaces that partially surround the light source and/or the converter. Light that leaves the light source or the converter in rearward or sideward direction and that would normally be lost can thus be captured and sent back to contribute to the useful light output of the device. Alternatively or additionally, light absorbing surfaces and/or diffusing surfaces might also be included, if the optical application would ask for such construction.

The design of the optical component depends on the desired application of the lighting device. Preferably, the optical component comprises a collimating part that redirects light coming from a focus region into a primary direction parallel to an optical axis of the device.

The lighting device may further comprise a lens for redirecting emitted light into a desired direction and for shaping the emitted beam. The lens may be a separate component or integrated into the optical component.

The light source of the light emitting device may in principle be realized by any suitable technology. It is preferably a blue or an UV light source. Moreover, it may favorably be realized by a Light Emitting Diode (LED), which is a solid light source that is readily available, and/or by Lasers or similar light sources (e.g. VCSELs (Vertical Cavity Surface Emitting Lasers) or VECSELs (Vertical External Cavity Surface Emitting Lasers)).

The invention further relates to a method for the production of a lighting device as it was described above, wherein said method comprises the following steps:

a) Placing a solid wavelength converter as an insert into a mould. Fixing the converter in the mould poses no problem as its rear surface (facing the light source in the final lighting device) and its front surface (oriented to the emission direction of the final lighting device) have to remain free and can thus be contacted by holders during the molding process. This could also be achieved by using tape assisted moulding processes.

b) Injection-moulding a material, particularly some plastic material like epoxy, LCP (Liquid Crystal Polymer), etc., around the insert (i.e. the converter), wherein said material forms the optical component. Thus a composite part comprising the converter and the optical component will be generated after solidification of the injected material. Optionally, the surfaces of the injected material can be coated with a reflective, diffusive or absorbing layer after solidification where this is needed.

c) Assembling the aforementioned composite part consisting of the converter and the optical component with a light source and optionally with further parts of the lighting device.

The described production method has two main advantages: First, a mechanically robust linkage between the converter and the optical component is achieved with minimal dimensional tolerances, and secondly said linkage can readily be produced simultaneously to the injection moulding of the optical component that would have to be done anyway.

These and other aspects of the invention will be apparent from and elucidated with reference to the embodiment(s) described hereinafter. These embodiments will be described by way of example with the help of the accompanying drawings in which.

Figure 1:
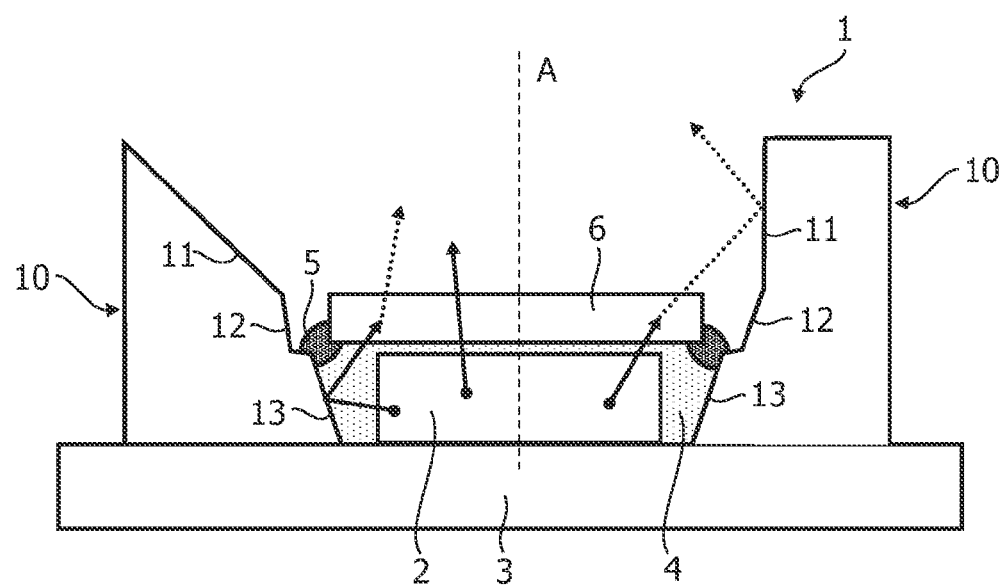
FIG. 1 shows schematically a cross section through a first embodiment of a lighting device according to the present invention wherein a ceramic converter is glued to an optical component.

Reference numbers in the Figures that differ by 100 refer to identical or similar components.

LED lighting devices are increasingly used due to their advantageous features like high efficiency and adjustable color temperature. LEDs are however different from conventional light bulbs in a number of ways. This means that luminaire manufacturers, such as automotive lighting set makers, have to learn to master new technology to be able to work with LEDs. Moreover, since the product lifetime of the LEDs is short and there is hardly any standardization, a substantial amount of development effort and time is needed for every new product. These problems could be ameliorated by the use of LED modules: LEDs dressed up with some functionality in order to have a well-defined mechanical, electrical, optical and thermal interface to the rest of the system. While the LEDs inside may change, the interfaces can be made to conform to certain standards.

Moreover, it can be important to "manipulate" the light emitted by an LED lighting device at the micro-level. This means that, e.g., collimation and cut-off (for the case of front lighting applications) are done very close to the light source. This has advantages for such items like etendue. In the further text the term "micro-optic element" will be used for the associated optical elements at micro-level.

White light can be generated with LEDs in two ways: with a combination of Red-, Green- and Blue LEDs or with a Yellow Phosphor covered Blue- or UV LED. In the latter case, the Phosphor can be replaced with a transparent or translucent ceramic. In the designs that will be proposed in the following, such ceramic converters will be used to extract the light out of the LEDs, particularly so-called Lumiramic tiles. Lumiramic tiles are ceramic phosphor converter plates which convert the blue light of a blue LED into another color, e.g., yellow or red, and show advantages over conventional Phosphor. The combination of a Lumiramic tile with the primary optics (collimator) allows to make a more efficient system in less production steps, wherein there is a preference to have color conversion happening very close to the LED. Moreover, the tile will preferably have the same size as the LED in order to maintain etendue.

The basic idea of the proposed designs is now to combine an optical component or a micro-optics part with a ceramic converter plate. This serves multiple purposes:

Both elements (micro-optic element and ceramic converter plate) are still used.

Problems associated with the usual attachment of a ceramic converter plate on top of an LED are avoided (such attachment is typically achieved with a refractive index-matching optical material, which is often a silicone like material that hardly gives strength, so possibly resulting in weak vibration behavior).

The combined micro-optic element and the ceramic converter plate can be made as a half-fabricate, making the final assembly of the optical part easier and allowing to pre-test that half-fabricate.

The micro-optic element can be made such that it helps to prevent some disadvantages of ceramic converter plates, such as the side-emission from the plate (i.e. the micro-optic element could capture and reflect the side-emitted light into the desired direction).

Also the combined micro-optic element and ceramic converter plate can be designed in such way that both the converter plate and the LED are protected from environmental effects and from misuse during further handling in assembly.

In the usual arrangement of LED chips and primary optics or micro-optic elements there are often a misalignment and optical losses caused by accuracy problems. Gaps cause optical losses: not all the flux from the LEDs is captured and/or the surface area from which the light comes is increased, leading to a lower brightness. Connecting different parts physically gives the possibility to eliminate some of these gaps.

FIG. 1 shows in this respect a first embodiment of a lighting device 1 according to the aforementioned concepts. Central element of this lighting device is a blue emitting LED 2 which is placed on a substrate 3 like a ceramic insulating substrate equipped with metal tracks, or any other suitable substrate type. The LED is surrounded by an optical component 10 ("micro-optic") which serves in its upper, shaped part as a collimator for directing light emitted by the device in the main direction of the optical axis A. To this end, the optical component 10 comprises lateral reflective surfaces 11.

The lighting device 1 further comprises a Lumiramic tile as a wavelength converting element 6. The converter 6 absorbs a part of the light emitted by the LED and re-emits it with a different (longer) wavelength. Thus the overall spectrum emitted by lighting device 1 is broadened, and particularly a white emission can be achieved.

The converter 6 is rigidly coupled to the optical component 10 by droplets or a continuous rim of a glue material 5.

The interstice between the LED 2, the converter 6, and the optical component 10 is filled with a transparent filling material 4, for example silicone. Thus a tight optical coupling is achieved and optical losses are minimized.

The optical component 10 further comprises reflective surfaces 11, 12 and 13 that surround the sides of the converter 6 and the LED 2, respectively. These surfaces should have a specular reflection and help to minimize light losses by redirecting sideward emissions back into the LED or the converter.

Figure 2:
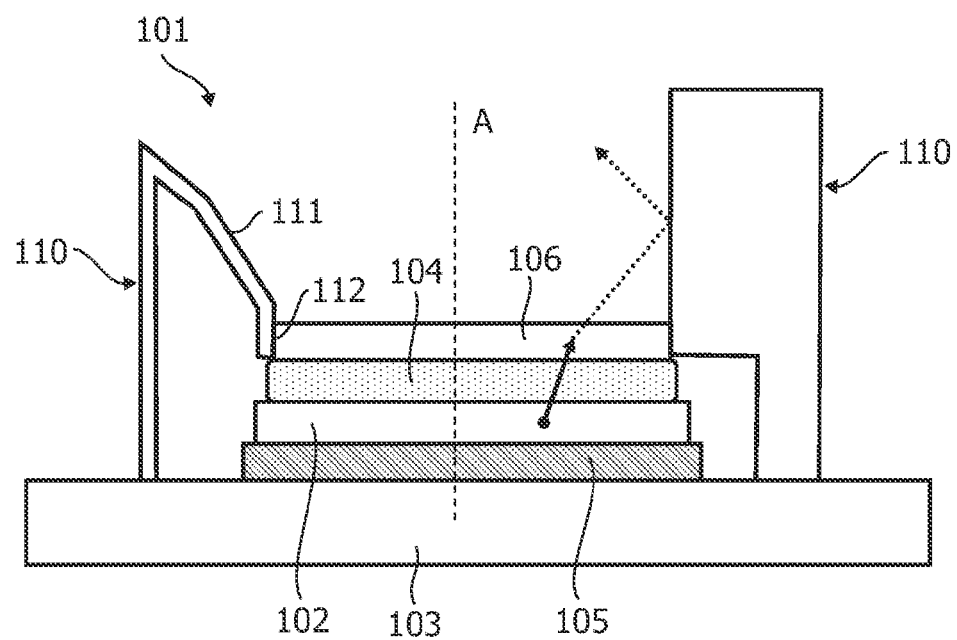
FIG. 2 shows schematically a cross section through a second embodiment of a lighting device according to the present invention wherein the optical component is molded around the ceramic converter.

FIG. 2 shows an alternative embodiment of a lighting device 101 according to the present invention, wherein similar components as in FIG. 1 have the same reference numbers increased by 100.

As above, the lighting device 101 comprises an LED 102 on a substrate 103 (in this case with an intermediate submount 105), a ceramic converter 106 (e.g. Lumiramic), and an optical component 110 comprising a collimator part with reflective surfaces 111. Moreover, the optical component 110 comprises reflective surfaces 112 surrounding the converter 106 to minimize light losses to the sides.

In contrast to FIG. 1, the optical component 110 of the lighting device 101 has a direct mechanical contact to the converter 106. The optical component 110 is produced by injection moulding, wherein the ceramic converter 106 is put in the mould so that it can be "over molded" (insert molded Lumiramic part). This eliminates the physical gaps between collimator 110 and converter 106. This assembly can then be mechanically attached to other parts of the module.

The collimator function of the optical component 110 is used for an etendue critical optical system. Depending upon the wanted degree of collimation, the length of the collimator can however become unrealistically large. By combining a small collimator with a lens, the length of the set up can be kept within limits. The small collimator is then called the primary optics and the lens the secondary optics.

To protect the system of thermo-mechanical stresses, a silicone pillow 104 can be disposed between the LED 102 and the converter 106 to give the system some expansion room.

The following functionalities of an LED lighting device can be taken care of by a single injection-molded part of the kind shown in FIGS. 1 and 2:
- the optical functionality, with one or more sides of a reflective collimator cup;
- the out-coupling functionality, provided by a Lumiramic tile that is connected to the LED substrate via silicon.

Building up a light-source module in the shown way allows to decrease the number of parts of the module, to optimize the light extraction of the LED chip, and to simplify the assembly of it. A possible application of the described designs is automotive front lighting, but other application areas in general lighting are of course also possible.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. A lighting device, comprising:
    an LED light source mounted on a substrate;
    a solid wavelength converter for converting light emitted by the light source into a different wavelength;
    an optical component acting as a reflector collimator and surrounding said LED light source and having a reflective surface for redirecting light emitted by the converter into a desired direction (A) out of the lighting device and preventing light emitted by said converter from passing through said reflector collimator, said reflector collimator of said optical component extends upwards from said substrate above said LED light source to redirect and collimate light in said desired direction (A), said reflector collimator extending above said LED light source around said light source to substantially capture light emitted by said LED light source;
    said reflector collimator collecting light emitted around said LED and not extending over said converter in said desired direction (A) emitted out of said LED light source;
    wherein the converter is mechanically carried by said optical component to form a separate, mechanically linked structure with said optical component and wherein said optical component reflector collimator extends above and around said LED light source, said reflector collimator mechanically carrying and supporting said solid wavelength converter and extending above said solid wavelength converter and further in optical alignment with light emitted by said LED light source to reflect light emitted by said LED light source passing through said converter.

2. The lighting device according to claim 1, wherein the light redirected by the converter is white light.

3. The lighting device according to claim 1, wherein the converter comprises a ceramic material.

4. The lighting device according to claim 1, wherein the converter is mechanically coupled to the optical component via an intermediate material.

5. The lighting device according to claim 1, wherein the converter is mechanically coupled to the optical component by molecular adhesion.

6. The lighting device according to claim 1, wherein the light source and the converter define a plurality of gaps therebetween, the lighting device further comprising a transparent material, filling the gaps.

7. The lighting device according to claim 1, wherein the optical component comprises reflective, diffusive or absorbing surfaces partially surrounding the converter.

8. The lighting device according to claim 1, further comprising a lens.

9. The lighting device according to claim 1, wherein the light source is selected from the group consisting of: a blue light source, an UV light source, a Light Emitting Diode, a Laser, a VCSEL and a VECSEL.

10. A lighting device, comprising:
    an LED light source mounted on a substrate;
    a solid wavelength ceramic plate converter mounted over and atop said LED light source to convert light emitted by said LED light source and exiting through a light exit surface;
    a non-transparent reflector surrounding said LED light source and having a reflective surface for redirecting light emitted by said ceramic plate converter into a desired direction (A) out of the said device, said reflector substantially surrounding said ceramic plate converter and not extending over said light exit surface of said ceramic plate converter, said light exit surface remaining unobstructed in said desired direction (A);
    said non-transparent reflector extending upwardly from said substrate above said LED light source to redirect and collimate light in said desired direction (A),
    said reflector collimator extending above said LED light source around said light source to substantially capture light emitted by said LED light source;
    wherein said ceramic plate converter is mechanically supported by said reflector to form a separate, mechanically linked structure with said reflector, and
    wherein said reflector extends around and above said LED light source, said reflector mechanically carrying and supporting said solid wavelength converter and extending above said solid wavelength converter and further in optical alignment with light emitted by said LED light source to reflect light emitted by said LED light source passing through said converter.

* * * * *